United States Patent
Yun et al.

(10) Patent No.: US 10,283,426 B2
(45) Date of Patent: May 7, 2019

(54) FAN-OUT SEMICONDUCTOR PACKAGE AND PHOTOSENSITIVE RESIN COMPOSITION

(71) Applicant: SAMSUNG ELECTRO-MECHANICS CO., LTD., Suwon-si, Gyeonggi-do (KR)

(72) Inventors: Geum Hee Yun, Suwon-si (KR); Hwa Young Lee, Suwon-si (KR); Su Yeon Lee, Suwon-si (KR); Yong Jin Park, Suwon-si (KR); Soo Young Yoon, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/637,725

(22) Filed: Jun. 29, 2017

(65) Prior Publication Data

US 2018/0102297 A1  Apr. 12, 2018

(30) Foreign Application Priority Data

Oct. 10, 2016 (KR) .................. 10-2016-0130797

(51) Int. Cl.
*H01L 23/29* (2006.01)
*H01L 23/24* (2006.01)
(Continued)

(52) U.S. Cl.
CPC .......... *H01L 23/295* (2013.01); *G03F 7/0388* (2013.01); *H01L 24/09* (2013.01);
(Continued)

(58) Field of Classification Search
CPC ........ H05K 3/287; H05K 3/284; H05K 3/285; G03F 7/038; G03F 7/0388; H01L 23/28;
(Continued)

(56) References Cited

U.S. PATENT DOCUMENTS

2002/0127418 A1 9/2002 Takeuchi et al.
2009/0085192 A1* 4/2009 Hsu .................. H01L 23/49827
257/700
(Continued)

FOREIGN PATENT DOCUMENTS

JP  3959261 B2  8/2007
JP  2011-075679 A  4/2011
(Continued)

OTHER PUBLICATIONS

Office Action issued in corresponding Japanese Patent Application No. 2017-123743, dated Jun. 5, 2018.
Office Action issued in corresponding Korean Patent Application No. 10-2016-0130797, dated Aug. 22, 2018.

*Primary Examiner* — Fernando L Toledo
*Assistant Examiner* — Aaron J Gray
(74) *Attorney, Agent, or Firm* — Morgan Lewis & Bockius LLP

(57) ABSTRACT

A fan-out semiconductor package includes: a semiconductor chip having an active surface with connection pads disposed thereon and an inactive surface opposing the active surface; an encapsulant encapsulating at least portions of the semiconductor chip; and a first connection member disposed on the active surface of the semiconductor chip, wherein the encapsulant is a cured photosensitive resin composition including a thermosetting resin, a carboxylic resin, an ethylenically unsaturated compound, and a reinforcing agent. The photosensitive resin composition may be used in the fan-out semiconductor package.

17 Claims, 11 Drawing Sheets

(51) Int. Cl.
*H01L 23/22* (2006.01)
*G03F 7/00* (2006.01)
*G03C 1/00* (2006.01)
*H05K 3/28* (2006.01)
*G03F 7/038* (2006.01)
*H01L 23/00* (2006.01)

(52) U.S. Cl.
CPC ............ *H05K 3/284* (2013.01); *H05K 3/287* (2013.01); *H01L 2924/15174* (2013.01); *H01L 2924/186* (2013.01)

(58) Field of Classification Search
CPC ..... H01L 23/29; H01L 23/293; H01L 23/295; H01L 2924/181; H01L 2924/186
USPC ........ 257/687, 773, 787, 788, 793; 438/127; 430/280.1, 270.1
See application file for complete search history.

(56) References Cited

U.S. PATENT DOCUMENTS

| | | | |
|---|---|---|---|
| 2011/0278736 A1* | 11/2011 | Lin | ................... H01L 25/50 257/774 |
| 2014/0291859 A1 | 10/2014 | Kiwanami et al. | |
| 2015/0138741 A1 | 5/2015 | Moon et al. | |

FOREIGN PATENT DOCUMENTS

| | | |
|---|---|---|
| JP | 2014-192452 A | 10/2014 |
| JP | 5787516 B2 | 9/2015 |
| JP | 2016-4818 A | 1/2016 |
| JP | 2016-60809 A | 4/2016 |
| JP | 2016-139804 A | 8/2016 |
| JP | 2016-178108 A | 10/2016 |
| KR | 10-2013-0132162 A | 12/2013 |
| KR | 10-2015-0102105 A | 9/2015 |
| WO | 2013/022068 A1 | 2/2013 |

* cited by examiner

I-I'

FAN-OUT SEMICONDUCTOR PACKAGE AND PHOTOSENSITIVE RESIN COMPOSITION

CROSS-REFERENCE TO RELATED APPLICATION(S)

This application claims the benefit of priority to Korean Patent Application No. 10-2016-0130797, filed on Oct. 10, 2016 in the Korean Intellectual Property Office, the disclosure of which is incorporated herein by reference in its entirety.

BACKGROUND

1. Field

The present disclosure relates to a fan-out semiconductor package and a photosensitive resin composition capable of being used as a material of an encapsulant of the fan-out semiconductor package.

2. Description of Related Art

Recently, a significant trend in the development of technology related to semiconductor chips has been to reduce the size of semiconductor chips. Therefore, in the field of package technology, in accordance with a rapid increase in demand for small-sized semiconductor chips, and the like, the implementation of a semiconductor package having a compact size while including a plurality of pins, has been demanded.

One type of package technology suggested to satisfy the technical demand as described above is a fan-out semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a photosensitive resin composition having excellent rigidity, suppressing deterioration of photosensitivity and a developing properties, suppressing the occurrence of warpage due to excellent flexibility of a cured film, and being able to be excellently filled in a hole or a cavity due to having good flowability, and a fan-out semiconductor package using the same as a material of an encapsulant.

According to an aspect of the present disclosure, a fan-out semiconductor package may be provided, in which a photosensitive resin composition including a thermosetting resin, a carboxylic resin, an ethylenically unsaturated compound, and a reinforcing agent is used as a material of an encapsulant encapsulating at least portions of a semiconductor chip.

According to an aspect of the present disclosure, a fan-out semiconductor package may include: a semiconductor chip having an active surface with connection pads disposed thereon and an inactive surface opposing the active surface; an encapsulant encapsulating at least portions of the semiconductor chip; and a first connection member disposed on the active surface of the semiconductor chip, wherein the encapsulant is a cured photosensitive resin composition including a thermosetting resin, a carboxylic resin, an ethylenically unsaturated compound, and a reinforcing agent.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The meaning of a "connection" of a component to another component in the description includes an indirect connection through an adhesive layer as well as a direct connection between two components. In addition, "electrically connected" encompasses the concepts of a physical connection and a physical disconnection. It can be understood that when an element is referred to using terms such as "first" and "second", the element is not limited thereby. They may only be used for a purpose of distinguishing one element from other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
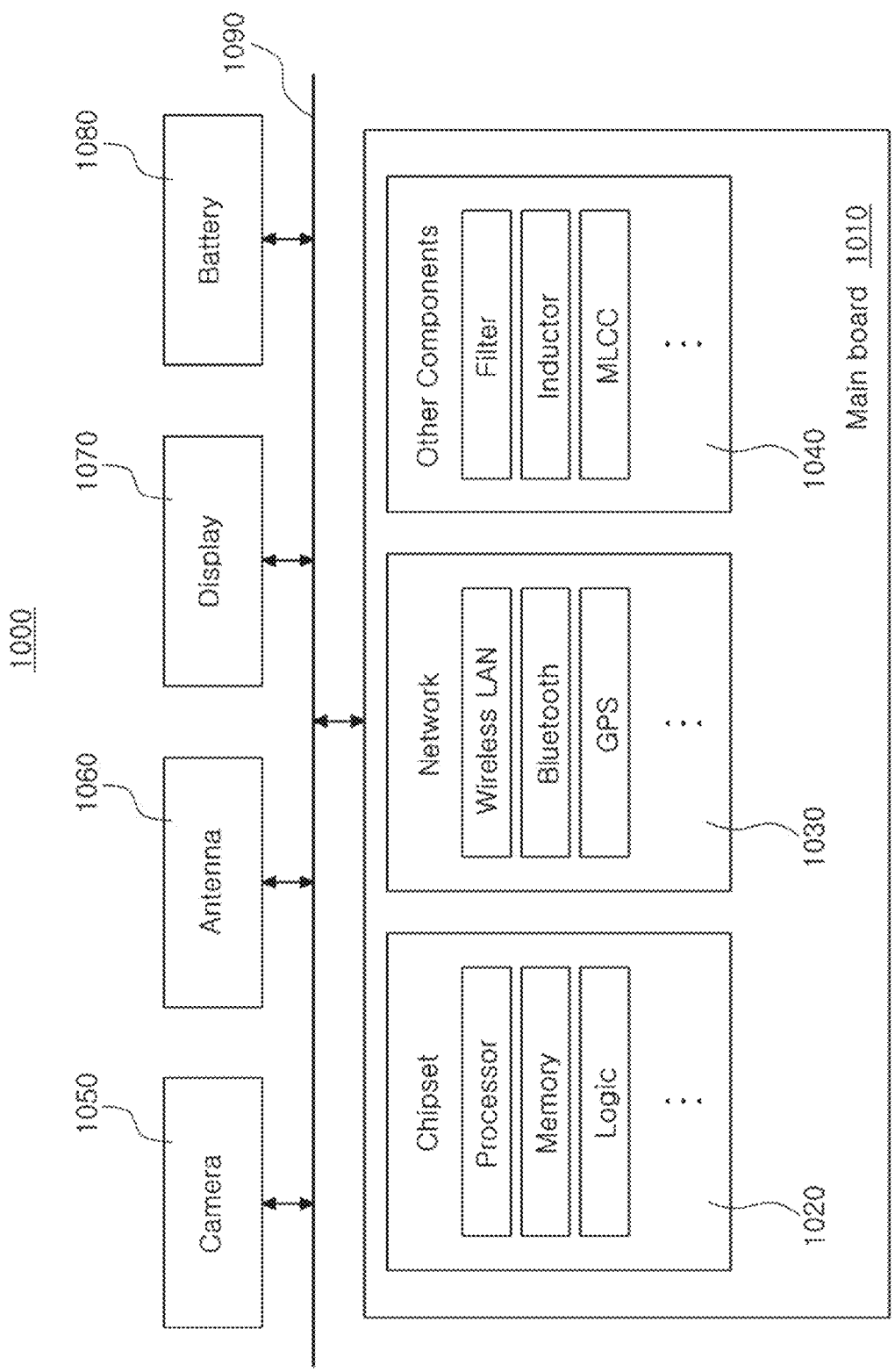
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the motherboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
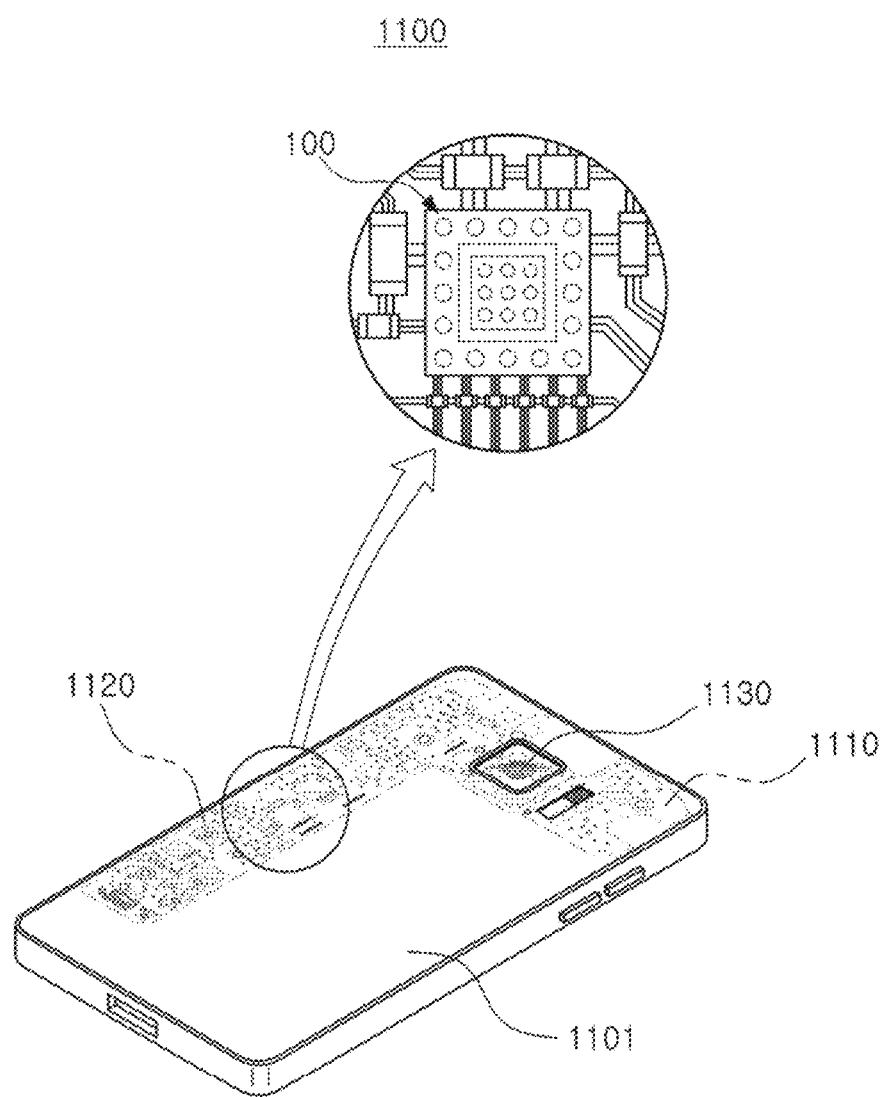
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip-related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured using the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
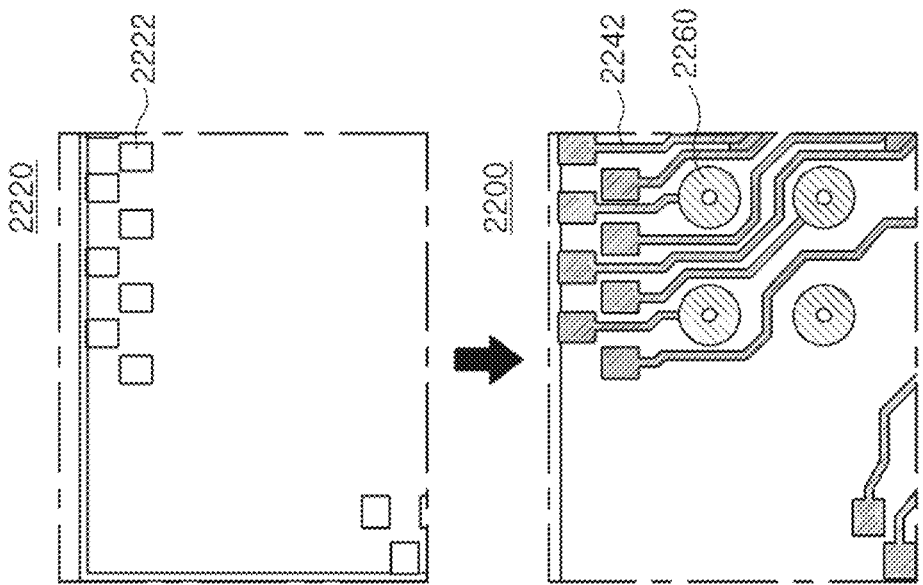
FIGS. 3A and 3B are schematic cross-sectional views illustrating states of a fan-in semiconductor package before and after being packaged.
Figure 3A:
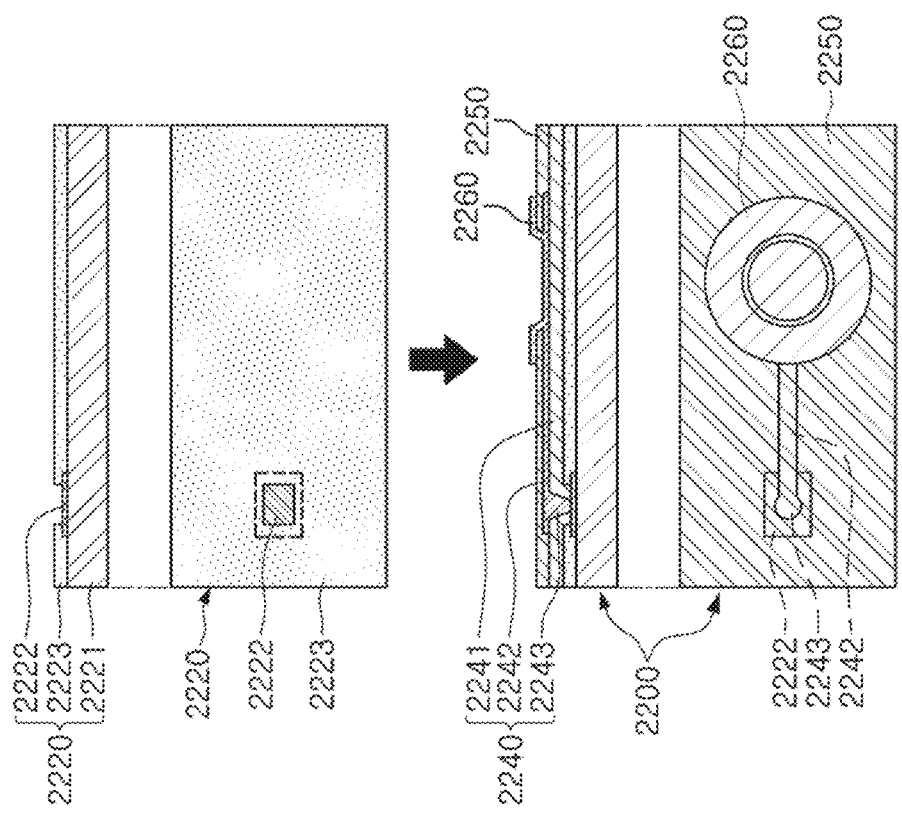

FIGS. 3A and 3B are schematic cross-sectional views illustrating states of a fan-in semiconductor package before and after being packaged.

Figure 4:
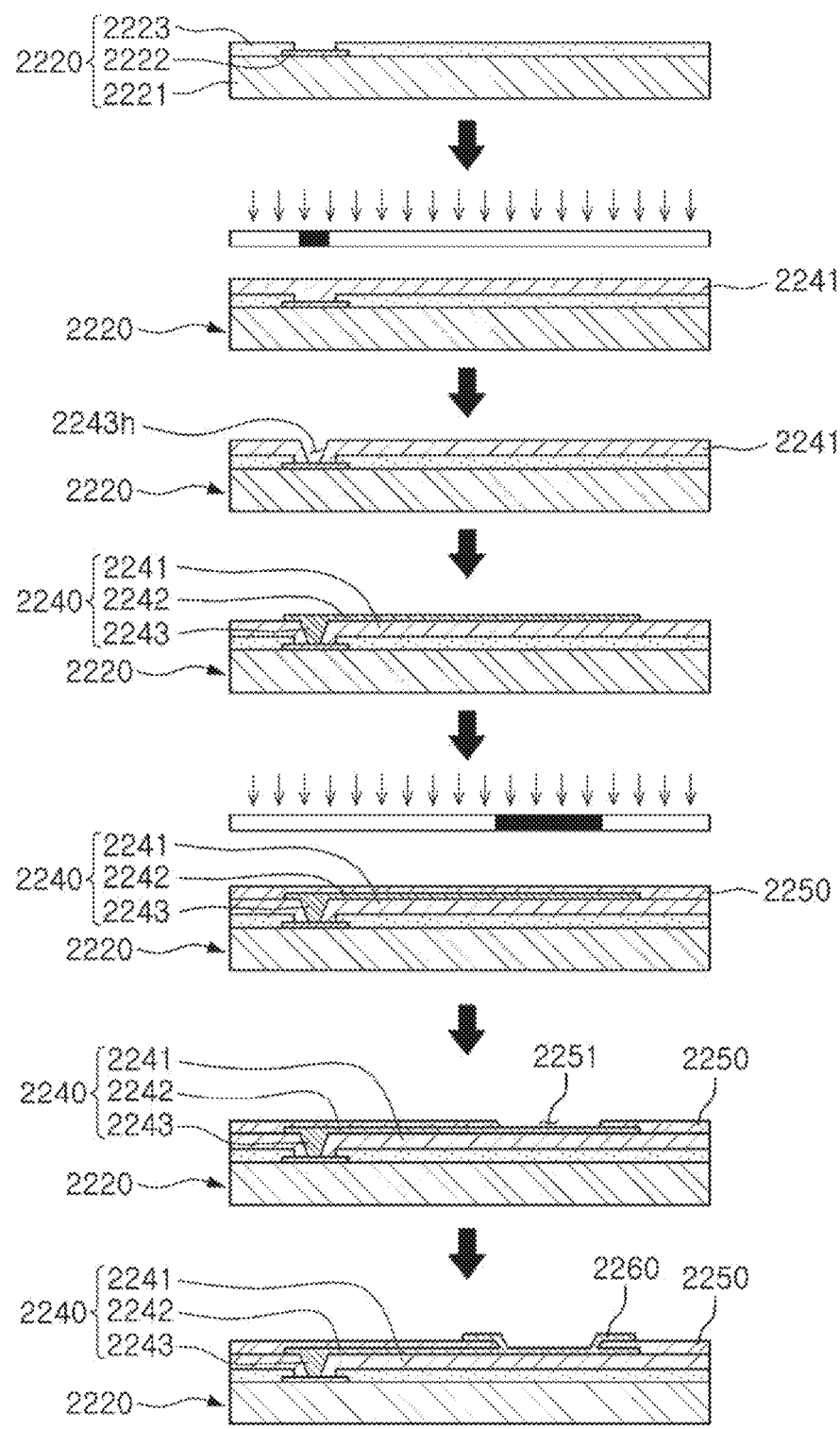
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, a connection member 2240 may be formed on the semiconductor chip 2220, depending on a size of the semiconductor chip 2220, in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a significant spatial limitation. Therefore, it may be difficult to apply this structure to a semiconductor chip having a large number of I/O terminals or a semiconductor chip having a compact size. In addition, due to the disadvantages described above, the fan-in semiconductor package may not be directly mounted and used on the main board of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
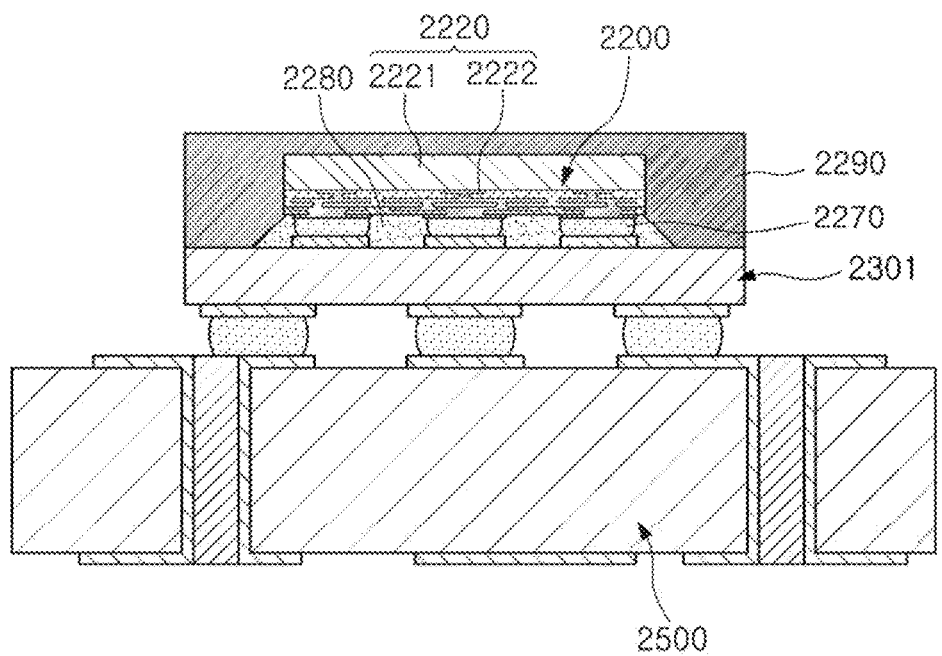
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
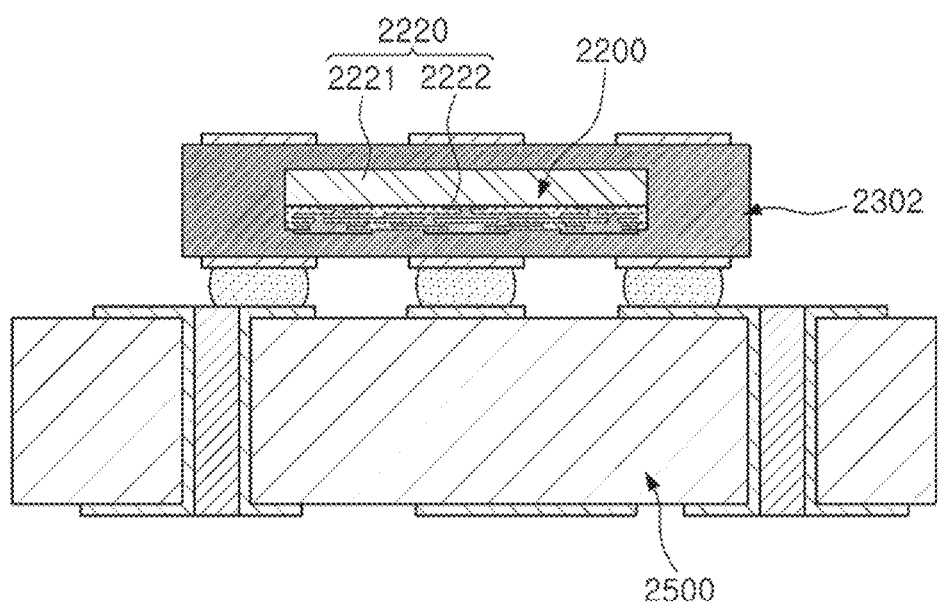
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
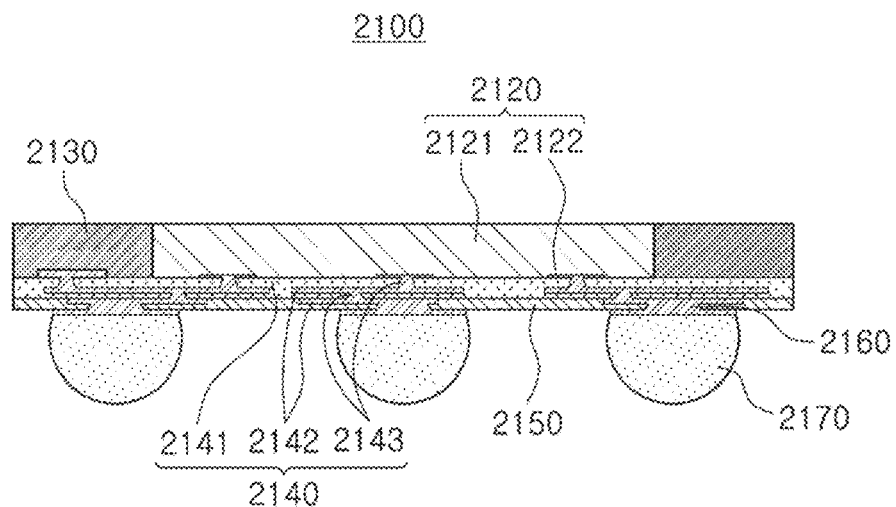
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
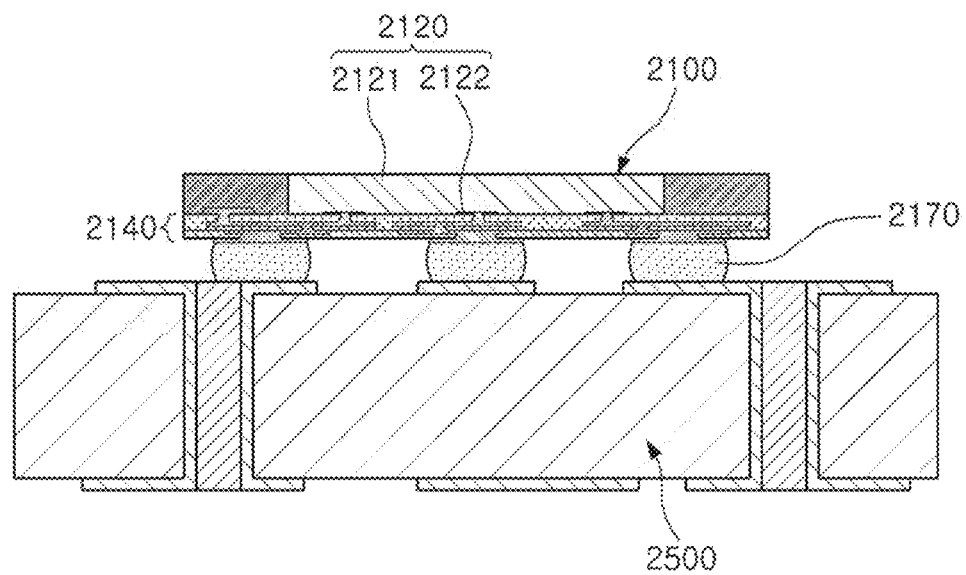
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region having a greater area than that of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile device. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package according to the present disclosure will hereinafter be described with reference to the drawings.

Figure 9:
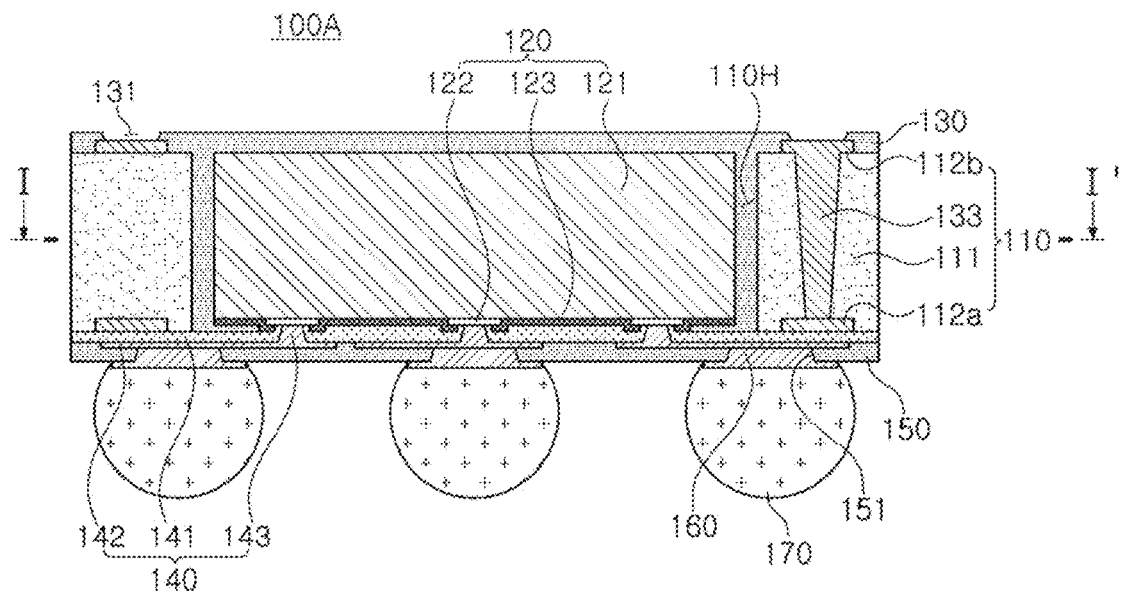
FIG. 9 is a schematic cross-sectional view illustrating an example of a fan-out semiconductor package.

FIG. 9 is a schematic cross-sectional view illustrating an example of a fan-out semiconductor package.

Figure 10:
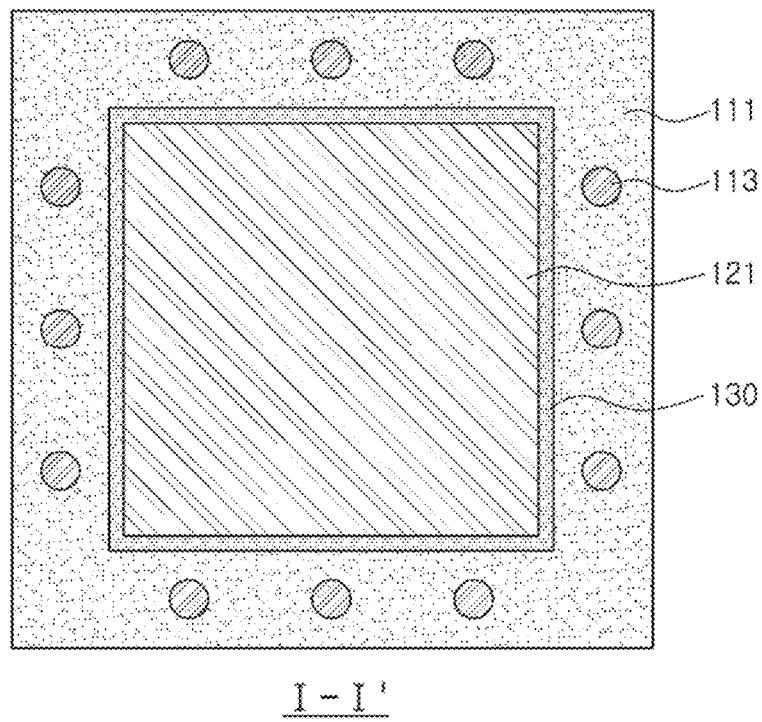
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a semiconductor chip 120 having an active surface with connection pads 122 disposed thereon and an inactive surface opposing the active surface, an encapsulant 130 encapsulating at least portions of the semiconductor chip 120, and a connection member 140 disposed on the active surface of the semiconductor chip 120. Here, the encapsulant 130 may be a cured photosensitive resin composition including a thermosetting resin, a carboxylic resin, an ethylenically unsaturated compound, and a reinforcing agent. The photosensitive resin composition may further include an initiator and a solvent. Since the encapsulant 130 is the cured photosensitive resin composition, the encapsulant 130 may have excellent rigidity, suppress deterioration of photosensitivity and a developing property, suppress occurrence of warpage due to excellent flexibility of a cured film, and may excellently fill a hole or a cavity due to excellent flowability.

The respective components included in the fan-out semiconductor package 100A according to the exemplary embodiment will hereinafter be described in more detail.

The semiconductor chip 120 may be an integrated circuit (IC) provided in an amount of several hundreds to several millions of elements, or more, integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions.

The encapsulant 130 may protect the semiconductor chip 120. An encapsulation form of the encapsulant 130 is not particularly limited, and the encapsulant 130 may surround at least portions of the semiconductor chip 120. For example, the encapsulant 130 may cover a connection member 110 to be described below and the inactive surface of the semiconductor chip 120, and fill spaces between walls of a through-hole 110H to be described below and side surfaces of the semiconductor chip 120. In addition, the encapsulant 130 may also fill at least a portion of a space between the passivation layer 123 of the semiconductor chip 120 and the connection member 140.

The encapsulant 130 may be a cured photosensitive resin composition including a thermosetting resin, a carboxylic resin, an ethylenically unsaturated compound, and a reinforcing agent. Therefore, openings 131, or the like, may be formed in the encapsulant 130 by a photolithography method, or the like. The photosensitive resin composition may further include an initiator and/or a solvent. For example, the photosensitive resin composition may include 7 to 12 wt % of thermosetting resin, 12 to 20 wt % of carboxylic resin, 2 to 4 wt % of an ethylenically unsaturated compound, 60 to 70 wt % of a reinforcing agent, 0.3 to 0.6 wt % of initiator, and 0 to 12 wt % of solvent, based on a total weight of the photosensitive resin composition.

(A) Thermosetting Resin

The thermosetting resin may be a thermosetting resin that may be thermally polymerized and/or be photopolymerized. As a non-restrictive example, the thermosetting resin may be an epoxy resin. The epoxy resin may be an epoxy resin having an aromatic ring. For example, the epoxy resin may include at least one of a bisphenol type epoxy resin and a biphenyl type epoxy resin. In this case, a viscosity of the composition may be sufficiently reduced to improve close adhesion to a conductive material such as copper and secure heat resistance characteristics such as solder heat resistance, PCT resistance, TC resistance, and the like, resulting in the prevention of the occurrence of several types of defects of the encapsulant. A specific example of the epoxy resin may include a biphenyl aralkyl type epoxy resin such as NC-3000H (a multifunctional solid epoxy resin containing a biphenyl skeleton) manufactured by Nippon Kayaku Co., Ltd., a biphenyl/phenol novolac type epoxy resin such as NC-3000 L, or the like, jER828, jER834, jER1001, and jER1004 manufactured by Mitsubishi Chemical, Co., Ltd., Epiclon 840, Epiclon 850, Epiclon 1050, and Epiclon 2055 manufactured by DIC Co., Ltd., and YD-011, YD-013, YD-127 YD-128, YD-128K, KDS-8170, KDS-8128 manufactured by Kukdo Chemical Co., Ltd, but are not limited thereto. For example, these resins may be used alone or a mixture of two or more thereof may be used. Particularly, a bisphenol A-type epoxy resin or a mixture resin including the bisphenol A-type epoxy resin may be used, but the epoxy resin is not limited thereto.

(B) Carboxylic Resin

Since the carboxylic resin has a carboxyl group, the carboxylic resin may enable a composition including the carboxylic resin and/or the cured composition to be developed by an alkaline aqueous solution. The carboxylic resin may have a thermosetting reaction group and an ethylenically unsaturated group. The thermosetting reaction group may be used for polymerization with a thermosetting resin. The ethylenically unsaturated group may be used for polymerization with an ethylenically unsaturated compound. That is, the carboxylic resin may be polymerized with both of the thermosetting resin and the ethylenically unsaturated compound. For example, the carboxylic resin may be a carboxylic epoxy acrylate resin. The carboxylic epoxy acrylate resin may be obtained by allowing an esterified product prepared by a reaction between an epoxy resin such as a bisphenol type epoxy resin, a biphenyl type epoxy resin, or the like, and acrylic acid, methacrylic acid, an unsaturated dibasic acid anhydride adduct of hydroxyl-containing acrylate such as hydroxyethyl(meth)acrylate, hydroxypropyl (meth)acrylate, hydroxybutyl(meth)acrylate, phenylglycidyl (meth)acrylate, (meth)acrylic acid-caprolactone adduct, or the like, to react to a saturated or unsaturated polybasic acid anhydride, for example, an aliphatic or aromatic dibasic acid anhydride such as methyl tetrahydrophthalic acid anhydride, tetrahydrophthalic acid anhydride, hexahydrophthalic acid anhydride, methyl hexahydrophthalic acid anhydride, succinic acid anhydride, maleic acid anhydride, phthalic acid anhydride, or itaconic acid anhydride. For example, the carboxylic epoxy acrylate resin may include a carboxylic cresol novolac type epoxy acrylate resin and/or a carboxylic bisphenol type epoxy acrylate resin, but is not limited thereto.

(C) Ethylenically Unsaturated Compound

The ethylenically unsaturated compound may be photocured by ultraviolet (UV) ray irradiation. Therefore, the ethylenically unsaturated compound may be insolubilized by an alkaline aqueous solution, or the like, such that patterns and vias may be formed in the encapsulant 130, or the like, after the ethylenically unsaturated compound is photocured. The ethylenically unsaturated compound may be photocured by active energy ray irradiation to help the carboxylic resin be insolubilized by the alkaline aqueous solution, or the like. As a non-restrictive example, the ethylenically unsaturated compound may be an acrylate compound. The acrylate compound may be, for example, at least one of hydroxyalkylacrylates such as 2-hydroxyethylacrylate, 2-hydroxypropylacrylate, and the like; mono- or di-acrylates of glycols such as ethylene glycol, methoxy tetraethylene glycol, polyethylene glycol, propylene glycol, and the like; acrylamides such as N,N-dimethylacrylamide, N-methylolacrylamide, N,N-dimethylaminopropylacrylamide, and the like; aminoalkylacrylates such as N,N-dimethylaminoethyl acrylate, N,N-dimethylaminopropyl acrylate, and the like; polyhydric alcohols such as hexanediol, trimethylolpropane, pentaerythritol, dipentaerythritol, tris-hydroxyethyl isocyanurate, and the like, or multifunctional acrylates such as ethyleneoxide adducts or propyleneoxide adducts thereof; acrylates such as phenoxyacrylate, bisphenol A diacrylate, and an ethyleneoxide adduct or propylene oxide adduct of these phenols; acrylates of glycidyl ether such as glycerin diglycidylether, glycerin triglycidylether, trimethylolpropane diglycidylether, trigylcidyl isocyanurate, and the like; and melamine acrylates and methacrylates corresponding the abovementioned acrylates, respectively, but is not limited thereto. Meanwhile, when multifunctional acrylates such as dipentaerythritol hexaacrylate, and the like, are used, compatibility of the multifunctional acrylates with the thermosetting resin and/or the carboxylic resin may be excellent, and the multifunctional acrylates may effectively help the carboxylic resin to be insolubilized by the alkaline aqueous solution, or the like.

(D) Reinforcing Agent

The reinforcing agent may be included in the photosensitive resin composition in order to provide rigidity. The reinforcing agent may be an inorganic filler. The inorganic filler may be an inorganic filler such as alumina, silica, or the like, and may be silica, but is not limited thereto. An average particle size of the inorganic filler such as the silica may be 500 nm to 1 μm, and a maximum particle size of the inorganic filler such as the silica may be 5 μm or less. In addition, a content of the inorganic filler such as the silica may be 60 wt % or more, based on a total weight of the photosensitive resin composition. In this case, the inorganic filler may provide particularly excellent rigidity to the encapsulant 130.

(E) Initiator

The initiator may be a photopolymerization initiator. The photopolymerization initiator may include benzoin and benzoin alkyl ethers such as benzoin, benzoin methylether, benzoin ethylether, benzoin isopropylether, and the like; acetophenones such as acetophenone, 2,2-dimethoxy-2-phenylacetophenone, 2,2-diethoxy-2-phenylacetophenone, 1,1-dichloroacetophenone, 1-[4-(4-benzoylphenylsulfanyl)-2-methyl-2-(4-methylphenylsulfanyl)propran-1-one, and the like; aminoacetophenones such as 2-methyl-1-[4-(methylthio)phenyl]-2-morpholinopropanone-1, 2-benzyl-2-dimethylamino-1-(4-morpholinophenyl)-butanone-1, and the like; anthraquinones such as 2-methylanthraquinone, 2-ethylanthraquinone, 2-tert-butylanthraquinone, 1-chloroanthraquinone, and the like; thioxanthones such as 2,4-dimethyl thioxanthone, 2,4-diethyl thioxanthone, 2-chlorothioxanthone, 2,4-diisopropyl thioxanthone, and the like; ketals such as acetophenonedimethylketal, benzyldimethylketal, and the like; benzophenones such as benzophenone, and the like, or xanthones; acylphosphine oxides such as bis(2,6-dimethoxybenzoyl)(2,4,4-trimethylpentyl)phosphine oxide, bis(2,4,6-trimethylbenzoyl)-phenylphosphine oxide, 2,4,6-trimethylbenzoyl diphenylphosphine oxide, ethyl-2,4,6-trimethylbenzoyl phenylphosphinate, and the like; various peroxides, and the like. These photopolymerization initiators may be used alone or a mixture of two or more thereof may be used.

(F) Solvent

The solvent may include ketones, aromatic hydrocarbons, glycolethers, glycolether acetates, esters, alcohols, aliphatic hydrocarbons, petroleum-based solvents, and the like. In more detail, the solvent may include ketones such as methylethylketone, cyclohexanone, and the like; aromatic hydrocarbons such as toluene, xylene, tetramethylbenzene, and the like; glycolethers such as cellosolve, methylcellosolve, butylcellosolve, carbitol, methyl carbitol, butyl carbitol, propyleneglycol monomethylether, dipropylene glycol monomethylether, dipropylene glycol diethylether, triethylene glycol monoethylether, and the like; esters such as ethyl acetate, butyl acetate, dipropylene glycol methylether acetate, propylene glycol methylether acetate, propylene glycol ethylether acetate, propylene glycol butylether acetate, and the like; alcohols such as ethanol, propanol, ethylene glycol, propylene glycol, and the like; aliphatic hydrocarbons such as octane, decane, and the like; petroleum-based solvents such as petroleum ether, petroleum naphtha, hydrogenated petroleum naphtha, solvent naphtha, and the like. These solvents may be used alone or a mixture of two or more thereof may be used.

The connection member 140 may be configured to redistribute the connection pads 122 of the semiconductor chip 120. Several tens to several hundreds of connection pads 122 having various functions may be redistributed by the connection member 140, and may be physically or electrically connected to an external source through connection terminals 170 to be described below depending on the functions. The connection member 140 may include insulating layers 141, redistribution layers 142 disposed on the insulating layers 141, and vias 143 penetrating through the insulating layers 141 and connected to the redistribution layers 142. In the fan-out semiconductor package 100A according to the exemplary embodiment, the connection member 140 may include a single layer, and may also include a plurality of layers.

A material of each of the insulating layers 141 may be an insulating material. In this case, a photosensitive insulating material such as a PID resin may also be used as the insulating material. When the insulating layers 141 are multiple layers, materials of the insulating layers 141 may be the same as each other, and may also be different from each other. When the insulating layers 141 are the multiple layers, the insulating layers 141 may be integrated with each other depending on a process, such that boundaries therebetween may also not be apparent.

The redistribution layers 142 may serve to substantially redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include various kinds of pads, and the like.

The vias 143 may electrically connect the connection pads 122, the redistribution layers 142, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape, and the like.

The fan-out semiconductor package 100A according to the exemplary embodiment may further include the connection member 110 having a through-hole 110H. The connection member 110 may maintain rigidity of the fan-out semiconductor package 100A depending on certain materials, and serve to secure uniformity of a thickness of the encapsulant 130. The fan-out semiconductor package 100A may be used as a portion of a package-on-package (POP) by the connection member 110. When the connection member 110 includes redistribution layers 112a and 112b, the number of layers of connection member 140 may be reduced, such that the fan-out semiconductor package 100A may be thinned and a yield problem due to a defect occurring in a process of manufacturing the connection member 140 may be suppressed. The semiconductor chip 120 may be disposed in the through-hole 110H to be spaced apart from the connection member 110 by a predetermined distance. The side surfaces of the semiconductor chip 120 may be surrounded by the connection member 110. However, such a form is only an example and may be variously modified to have other forms, and the connection member 110 may perform another function depending on such a form.

The connection member 110 may include an insulating layer 111, a first redistribution layer 112a in contact with the connection member 140 and embedded in a first surface of the insulating layer 111, and a second redistribution layer 112b disposed on a second surface of the insulating layer 111 opposing the first surface of the insulating layer 111. The first and second redistribution layers 112a and 112b may be electrically connected to each other through vias 113. Since the first redistribution layer 112a is embedded in the insulating layer 111, an insulating distance of the insulating layer 141 of the connection member 140 may be substantially constant. Thicknesses of the redistribution layers 112a and 112b of the connection member 110 may be greater than those of the redistribution layers 142 of the connection member 140. Since the connection member 110 may have a thickness equal to or greater than that of the semiconductor chip 120, the redistribution layers 112a and 112b may be formed to have large sizes, depending on a scale of the connection member 110. The redistribution layers 142 of the connection member 140 may be formed at relatively small sizes for thinness.

For example, a material including an inorganic filler and an insulating resin, for example, a thermosetting resin such as an epoxy resin, a thermoplastic resin such as a polyimide resin, or a resin having a reinforcing material such as an inorganic filler impregnated in the thermosetting resin and the thermoplastic resin, more specifically, Ajinomoto Build up Film (ABF), FR-4, Bismaleimide Triazine (BT), a photoimagable dielectric (PID) resin, or the like, may be used as the material of the insulating layer. Alternatively, a material in which a thermosetting resin or a thermoplastic resin is impregnated together with an inorganic filler in a core material such as a glass fiber (or a glass cloth or a glass fabric), for example, prepreg, or the like, may also be used.

The redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may perform various functions depending on designs of their corresponding layers. For example, the redistribution layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a and 112b may include via pads, connection terminal pads, and the like. A surface treatment layer may be formed on surfaces of pad patterns, or the like, exposed from the second redistribution layer 112b through the openings 131 penetrating through the encapsulant 130. The surface treatment layer may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 113 may electrically connect the redistribution layers 112a and 112b formed on different layers to each other, resulting in an electrical path in the connection member 110. A material of each of the vias 113 may be a conductive material. Each of the vias 113 may be completely filled with the conductive material, or the conductive material may be formed along a wall of each of via holes. In addition, each of the vias 113 may have all of the shapes known in the related art, such as a tapered shape, a cylindrical shape, and the like. Meanwhile, when holes for the vias 113 are formed, some of the pads of the first redistribution layer 112a may serve as a stopper, and it may thus be advantageous in a process in which each of the vias 113 has the tapered shape of which a width of an upper surface is greater than that of a lower surface. In this case, the vias 113 may be integrated with portions of the second redistribution layer 112b.

The fan-out semiconductor package 100A according to the exemplary embodiment may further include a passivation layer 150. The passivation layer 150 may be additionally configured to protect the connection member 140 from external physical or chemical damage. The passivation layer 150 may have openings 151 exposing at least portions of the redistribution layer 142 of the connection member 140. The openings may be provided in an amount of several tens to several thousands.

A material of the passivation layer 150 is not particularly limited, but may be a photosensitive insulating material such as a PID resin. Alternatively, a solder resist may also be used as the material of the passivation layer 150. Alternatively, an insulating resin that does not include a core material, but includes a filler, for example, ABF, including an inorganic filler and an epoxy resin, may be used as the material of the passivation layer 150. When an insulating material that includes an inorganic filler and an insulating resin, but does not include a core material, such as the ABF, or the like, is used as the material of the passivation layer 150, the passivation layer 150 and a resin layer 182 to be described below may have an opposite effect to each other, and may control warpage dispersion, which may be more effective in controlling warpage. When the insulating material including the inorganic filler and the insulating resin, such as the ABF, or the like, is used as the material of the passivation layer 150, the insulating layer 141 of the connection member 140 may also include an inorganic filler and an insulating resin. In this case, a weight percentage of the inorganic filler included in the passivation layer 150 may be greater than that of the inorganic filler included in the insulating layer 141 of the connection member 140. In this case, the passivation layer 150 may have a relatively low CTE, and may be utilized to control the warpage.

The fan-out semiconductor package 100A according to the exemplary embodiment may further include an underbump metal layer 160. The underbump metal layer 160 may be additionally configured to improve connection reliability of the connection terminals 170 and improve board level reliability of the fan-out semiconductor package 100A. The underbump metal layer 160 may be connected to the redistribution layer 142 of the connection member 140 opened through the openings 151 of the passivation layer 150. The underbump metal layer 160 may be formed in the openings 151 of the passivation layer 150 by the known metallization method using the known conductive metal such as a metal, but is not limited thereto.

The fan-out semiconductor package 100A according to the exemplary embodiment may further include the connection terminals 170. The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be more excellent.

At least one of the connection terminals 170 may be disposed in a fan-out region. The fan-out region is a region except for a region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a reduced thickness, and may have price competitiveness.

Although not illustrated in the drawings, a metal layer may further be disposed on the wall of the through-hole 110H. The metal layer may serve to effectively dissipate heat generated by the semiconductor chip 120. In addition, the metal layer may also serve to block electromagnetic waves. In addition, a separate passive component such as a capacitor, an inductor, or the like, may further be disposed in the through-hole 110H. In addition, a plurality of semiconductor chips 120 may be disposed in the through-hole 110H. In addition, the number of through-holes 110H may be plural and semiconductor chips 120 or passive components may be disposed in the through-holes 110H, respectively. In addition to the structures described above, the structures known in the related art may be applied.

Figure 11:
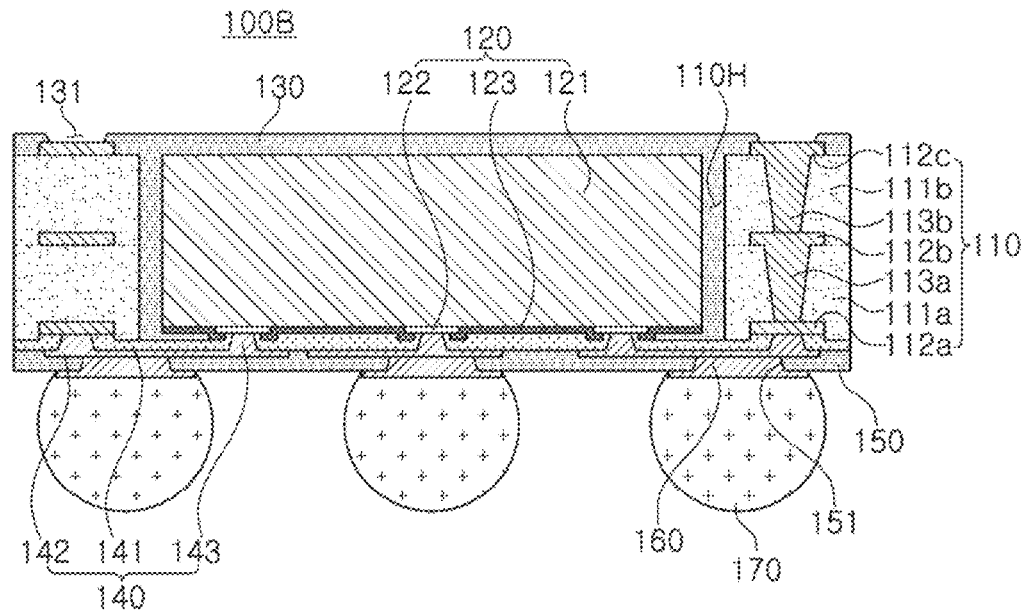
FIG. 11 is a schematic cross-sectional view illustrating another example of a fan-out semiconductor package.

FIG. 11 is a schematic cross-sectional view illustrating another example of a fan-out semiconductor package.

Referring to the drawing, in a fan-out semiconductor package 100B according to another exemplary embodiment in the present disclosure, a connection member 110 may include a first insulating layer 111a, a first redistribution layer 112a in contact with connection members 140 and embedded in a first surface of the first insulating layer 111a, a second redistribution layer 112b disposed on a second surface of the first insulating layer 111a opposing the first surface of the first insulating layer 111a, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. The first and second redistribution layers 112a and 112b and the second and third redistribution layers 112b and 112c may be electrically connected to each other through first and second vias 113a and 113b penetrating through the first and second insulating layers 111a and 111b, respectively.

Since the first redistribution layer 112a is embedded in the first insulating layer 111a, an insulating distance of an insulating layer 141 of the connection member 140 may be substantially constant, as described above. Since the connection member 110 may include a large number of redistribution layers 112a, 112b, and 112c, the connection member 140 may further be simplified. Therefore, a decrease in a yield depending on a defect occurring in a process of forming the connection member 140 may be suppressed. The first redistribution layer 112a may be recessed in the first insulating layer 111a, such that a lower surface of the first insulating layer 111a may have a step with respect to a lower surface of the first redistribution layer 112a. Resultantly, when an encapsulant 130 is formed, a phenomenon in which a material of the encapsulant 130 bleeds to pollute the first redistribution layer 112a may be prevented.

The lower surface of the first redistribution layer 112a of the connection member 110 may be disposed on a level above a lower surface of the connection pad 122 of a semiconductor chip 120. In addition, a distance between a redistribution layer 142 of the connection member 140 and the first redistribution layer 112a of the connection member 110 may be greater than that between the redistribution layer 142 of the connection member 140 and the connection pad 122 of the semiconductor chip 120. The reason is that the first redistribution layer 112a may be recessed into the first insulating layer 111a. The second redistribution layer 112b of the connection member 110 may be disposed on a level between an active surface and an inactive surface of the semiconductor chip 120. The connection member 110 may be formed to have a thickness corresponding to that of the semiconductor chip 120. Therefore, the second redistribution layer 112b formed in the connection member 110 may be disposed on a level between the active surface and the inactive surface of the semiconductor chip 120.

Thicknesses of the redistribution layers 112a, 112b, and 112c of the connection member 110 may be greater than those of the redistribution layers 142 of the connection member 140. Since the connection member 110 may have a thickness equal to or greater than that of the semiconductor chip 120, the redistribution layers 112a, 112b, and 112c may be formed to have large sizes, depending on a scale of the connection member 110. On the other hand, the redistribution layers 142 of the connection member 140 may be formed at relatively small sizes for thinness.

Descriptions of configurations overlapping those provided above will be omitted hereinafter.

Figure 12:
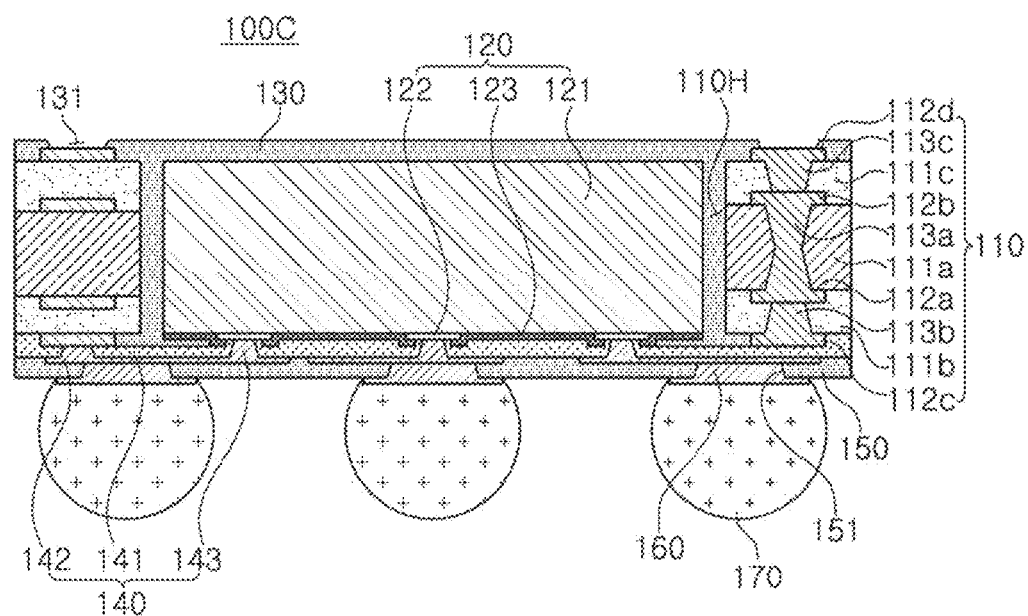
FIG. 12 is a schematic cross-sectional view illustrating another example of a fan-out semiconductor package.

FIG. 12 is a schematic cross-sectional view illustrating another example of a fan-out semiconductor package.

Referring to the drawing, in a fan-out semiconductor package 100C according to another exemplary embodiment in the present disclosure, a connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the connection member 110 may include a large number of redistribution layers 112a, 112b, 112c, and 112d, the connection member 140 may further be simplified. Therefore, a decrease in a yield depending on a defect occurring in a process of forming the connection member 140 may be suppressed. The first to fourth redistribution layers 112a, 112b, 112c, and 112d may be electrically connected to each other through first to third vias 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto. Similarly, the first via 113a may have a diameter greater than those of the second via 113b and the third via 113c.

A lower surface of the third redistribution layer 112c of the connection member 110 may be disposed on a level below a lower surface of the connection pad 122 of a semiconductor chip 120. In addition, a distance between a redistribution layer 142 of the connection member 140 and the third redistribution layer 112c of the connection member 110 may be smaller than that between the redistribution layer 142 of the connection member 140 and the connection pad 122 of the semiconductor chip 120. The reason is that the third redistribution layer 112c may be disposed in a protruding form on the second insulating layer 111b, resulting in contacting the connection member 140. The first redistribution layer 112a and the second redistribution layer 112b of the connection member 110 may be disposed on a level between an active surface and an inactive surface of the semiconductor chip 120. The connection member 110 may be formed to have a thickness corresponding to that of the semiconductor chip 120. Therefore, the first redistribution layer 112a and the second redistribution layer 112b formed in the connection member 110 may be disposed on a level between the active surface and the inactive surface of the semiconductor chip 120.

Thicknesses of the redistribution layers 112a, 112b, 112c, and 112d of the connection member 110 may be greater than those of the redistribution layers 142 of the connection member 140. Since the connection member 110 may have a thickness equal to or greater than that of the semiconductor chip 120, the redistribution layers 112a, 112b, 112c, and 112d may be formed at large sizes. On the other hand, the redistribution layers 142 of the connection member 140 may be formed at relatively small sizes for thinness.

Descriptions of configurations overlapping those provided above will be omitted hereinafter.

Figure 13:
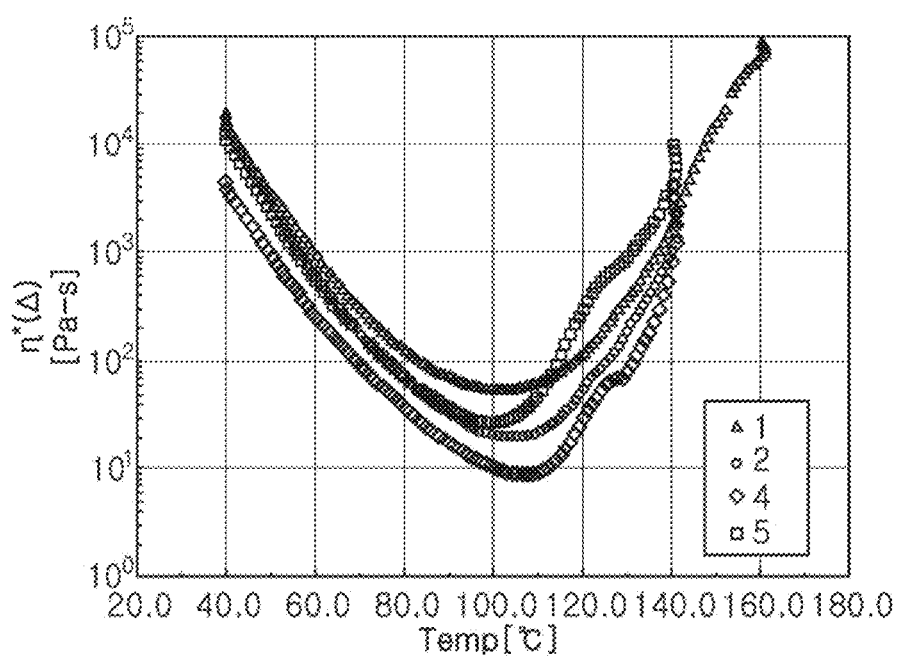
FIG. 13 is a graph schematically illustrating viscosities of a photosensitive resin composition according to the present disclosure measured by a rheometer.

FIG. 13 is a graph illustrating viscosities of a photosensitive resin composition according to the present disclosure measured by a rheometer.

Figure 14:
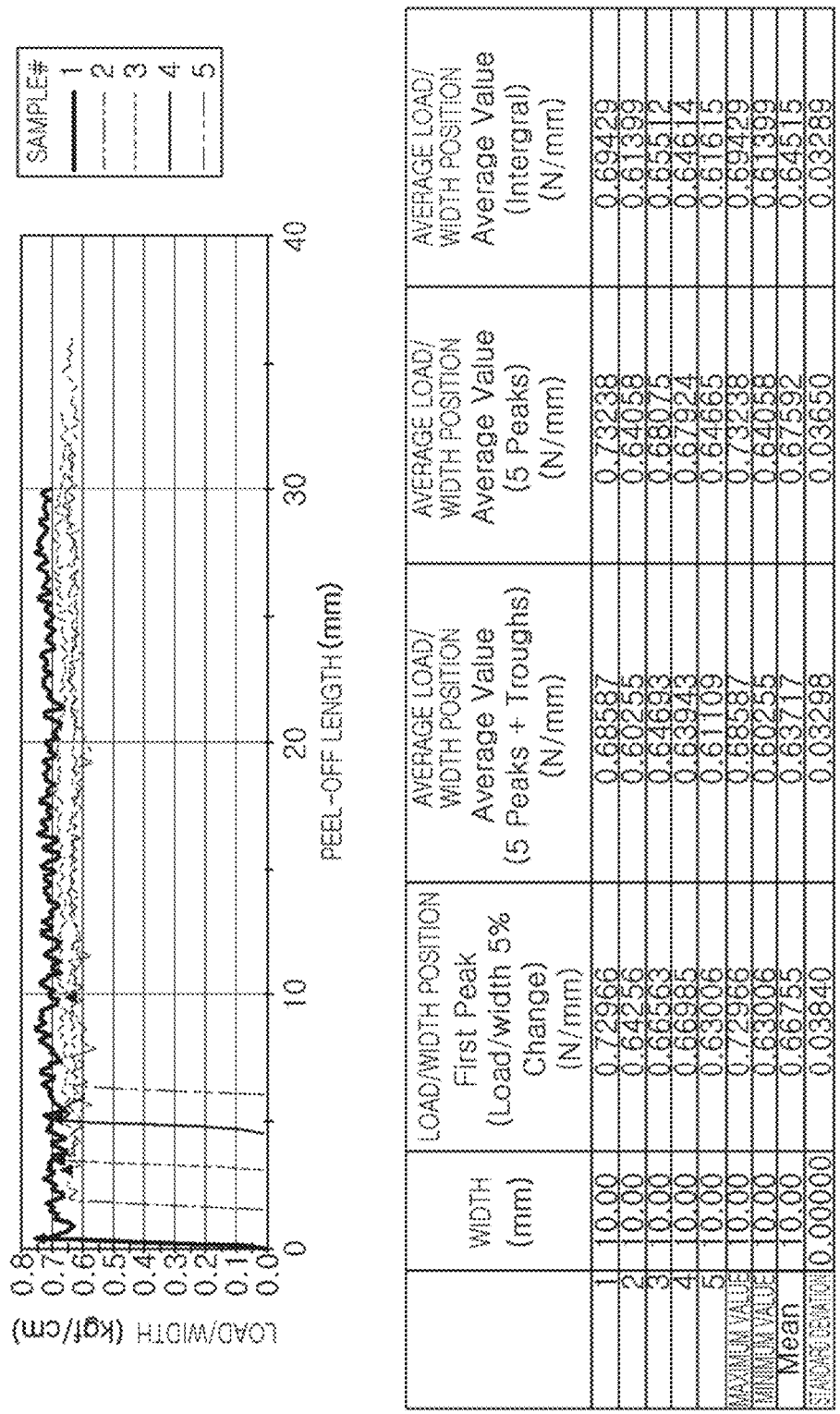
FIGS. 14 and 15 are charts and tables illustrating peel strengths between the cured photosensitive resin composition according to the present disclosure and a copper foil.
Figure 15:
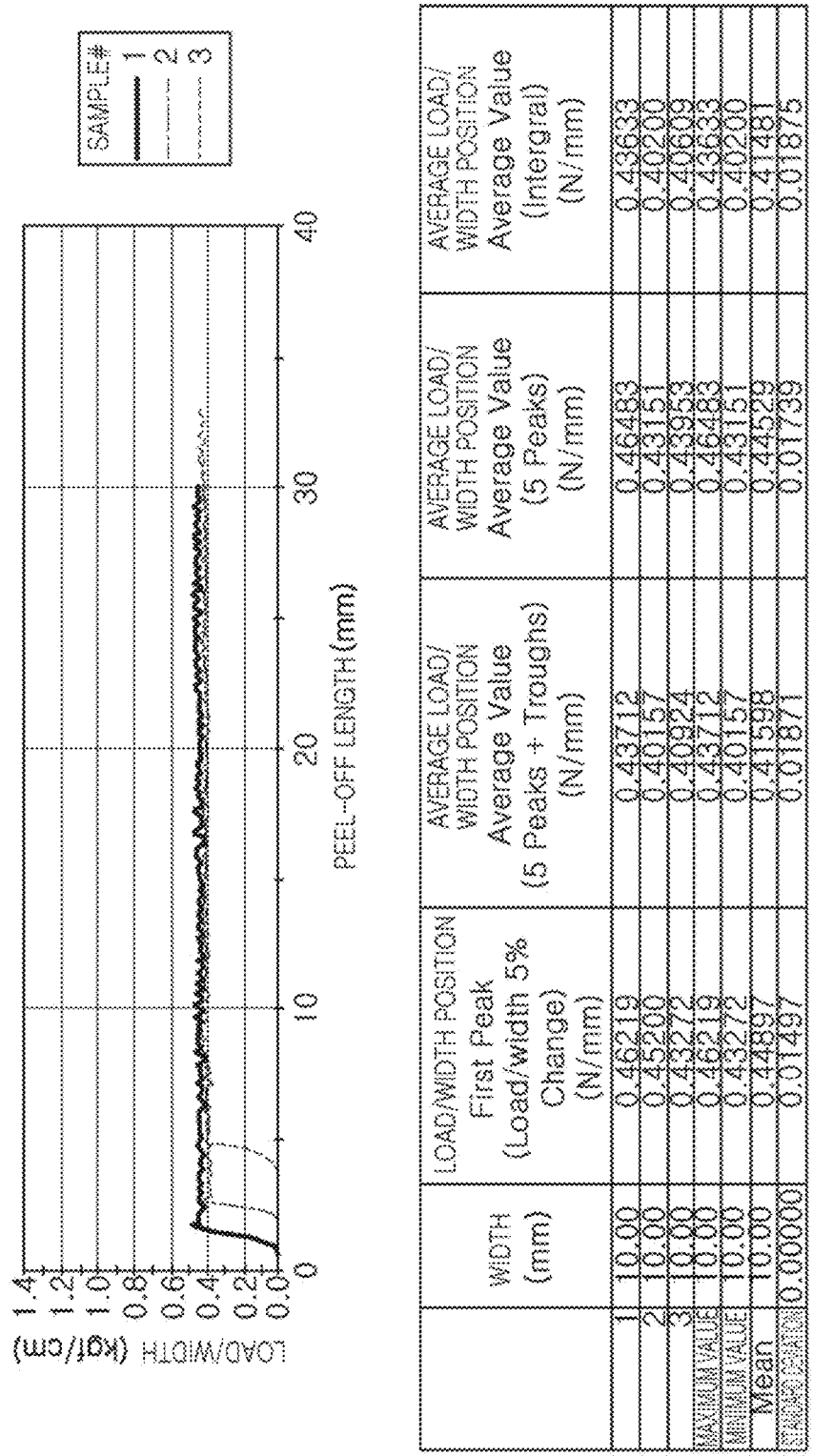

FIGS. 14 and 15 include charts and tables illustrating peel strengths between the cured photosensitive resin composition according to the present disclosure and a copper foil.

Compositions of photosensitive resin compositions used in experiments are illustrated in Table 1.

It may be appreciated from the drawings that when the photosensitive resin composition according to the present disclosure is used, even though a content of silica having a high Moh's hardness of 7 exceeds 60 wt %, flowability of an alkaline developing type photosensitive resin composition is sufficiently secured, such that the alkaline developing type photosensitive resin composition excellently fills a hole or a cavity and does not need to be post-cured, but even though the alkaline developing type photosensitive resin composition is post-cured, the alkaline developing type photosensitive resin composition includes a resin that may sufficiently alleviate curing contraction, such that a peel strength between the alkaline developing type photosensitive resin composition and copper may be sufficient.

As set forth above, according to the exemplary embodiments in the present disclosure, a photosensitive resin composition having excellent rigidity, suppressing deterioration of photosensitivity and a developing property, suppressing occurrence of warpage due to excellent flexibility of a cured film, and excellently filling a hole or a cavity due to excellent flowability, and a fan-out semiconductor package using the same as a material of an encapsulant may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a semiconductor chip having an active surface with connection pads disposed thereon and an inactive surface opposing the active surface;
   an encapsulant encapsulating at least portions of the semiconductor chip; and
   a first connection member disposed on the active surface of the semiconductor chip,
   wherein the encapsulant includes a cured photosensitive resin composition including 7 to 12 wt % of thermosetting resin, 12 to 20 wt % of carboxylic resin, 2 to 4 wt % ethylenically unsaturated compound, and 60 to 70 wt % reinforcing agent, based on a total weight of the photosensitive resin composition.

2. The fan-out semiconductor package of claim 1, wherein the carboxylic resin has a thermosetting reaction group and an ethylenically unsaturated group.

TABLE 1

| | | Sample # | | | | |
|---|---|---|---|---|---|---|
| | | 1 | 2 | 3 | 4 | 5 |
| Epoxy | Bisphenol A type | 9 wt % | 9 wt % | 9 wt % | 9 wt % | 9 wt % |
| Epoxy | Biphenyl type | 2 wt % | 2 wt % | 2 wt % | 2 wt % | 2 wt % |
| Silica Slurry (D50) | 500 nm | 65 wt % | 65 wt % | 65 wt % | — | 65 wt % |
| Silica Slurry (D50) | 1 μm | — | — | — | 65 wt % | — |
| Acid modified Epoxy acrylate | Cresol novolac type | 14 wt % | 14 wt % | 14 wt % | 14 wt % | 14 wt % |
| Acid modified Epoxy acrylate | Bisphenol F type | 6 wt % | 6 wt % | 6 wt % | 6 wt % | 6 wt % |
| Acrylate | Dipentaerythritol Hexa Acrylate | 3 wt % | 3 wt % | 3 wt % | 3 wt % | 3 wt % |
| Photoinitator | Acylphosphine oxide | 0.3 wt % | 0.3 wt % | 0.2 wt % | 0.3 wt % | 0.3 wt % |
| Photoinitator | benzophenon | 0.2 wt % | 0.1 wt % | 0.2 wt % | 0.2 wt % | 0.1 wt % |
| Additives | — | — | 0.5 wt % | 0.6 wt % | 0.6 wt % | 0.5 wt % | 0.6 wt % |

3. The fan-out semiconductor package of claim 1, wherein the thermosetting resin includes an epoxy resin,
the carboxylic resin includes a carboxylic epoxy acrylate resin,
the ethylenically unsaturated compound includes an acrylate compound, and
the reinforcing agent includes an inorganic filler.

4. The fan-out semiconductor package of claim 3, wherein the epoxy resin includes at least one of a bisphenol type epoxy resin and a biphenyl type epoxy resin.

5. The fan-out semiconductor package of claim 3, wherein the carboxylic epoxy acrylate resin includes at least one of a carboxylic cresol novolac type epoxy acrylate resin and a carboxylic bisphenol type epoxy acrylate resin.

6. The fan-out semiconductor package of claim 3, wherein the acrylate compound includes a multifunctional acrylate.

7. The fan-out semiconductor package of claim 3, wherein the inorganic filler includes silica.

8. The fan-out semiconductor package of claim 1, further comprising a second connection member having a through-hole,
wherein the semiconductor chip is disposed in the through-hole, and
the encapsulants fills a portion of the through-hole and is in physical contact with a side surface of the semiconductor chip connecting the inactive surface and the active surface of the semiconductor chip.

9. The fan-out semiconductor package of claim 8, wherein the second connection member includes a first insulating layer, a first redistribution layer in contact with the first connection member and embedded in a first surface of the first insulating layer, a second redistribution layer disposed on a second surface of the first insulating layer opposing the first surface of the first insulating layer, and a first via penetrating through the first insulating layer, having a width smaller than a width of the first redistribution layer and a width of the second redistribution layer, and connecting the first and second redistribution layers to each other, and
the first and second redistribution layers are electrically connected to the connection pads.

10. The fan-out semiconductor package of claim 9, wherein the second connection member further includes a second insulating layer disposed on the first insulating layer and covering the second redistribution layer, a third redistribution layer disposed on the second insulating layer, and a second via penetrating through the second insulating layer, having a width smaller than the width of the second redistribution layer and a width of the third redistribution layer, and connecting the second and third redistribution layers to each other, and
the third redistribution layer is electrically connected to the connection pads.

11. The fan-out semiconductor package of claim 8, wherein the second connection member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer, and
the first to third redistribution layers are electrically connected to the connection pads.

12. The fan-out semiconductor package of claim 11, wherein the second connection member further includes a third insulating layer disposed on the first insulating layer and covering the second redistribution layer and a fourth redistribution layer disposed on the third insulating layer, and
the fourth redistribution layer is electrically connected to the connection pads.

13. A photosensitive resin composition comprising:
7 to 12 wt % thermosetting resin, 12 to 20 wt % carboxylic resin, 2 to 4 wt % ethylenically unsaturated compound, and 60 to 70 wt % reinforcing agent, based on a total weight of the photosensitive resin composition.

14. The photosensitive resin composition of claim 13, further comprising:
an initiator; and
a solvent.

15. The photosensitive resin composition of claim 14, wherein the thermosetting resin includes an epoxy resin,
the carboxylic resin includes a carboxylic epoxy acrylate resin,
the ethylenically unsaturated compound includes an acrylate compound,
the reinforcing agent includes an inorganic filler, and
the initiator includes a photopolymerization initiator.

16. The photosensitive resin composition of claim 15, wherein a content of the inorganic filler is 60 wt % or more, based on the total weight of the photosensitive resin composition.

17. The photosensitive resin composition of claim 14, wherein the photosensitive resin composition includes:
0.3 to 0.6 wt % of the initiator, and 0 to 12 wt % of the solvent, based on the total weight of the photosensitive resin composition.

* * * * *